United States Patent
Dubin

(10) Patent No.: US 7,105,851 B2
(45) Date of Patent: Sep. 12, 2006

(54) NANOTUBES FOR INTEGRATED CIRCUITS

(75) Inventor: Valery M. Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/671,322

(22) Filed: Sep. 24, 2003

(65) Prior Publication Data

US 2005/0062034 A1    Mar. 24, 2005

(51) Int. Cl.
*H01L 29/786* (2006.01)

(52) U.S. Cl. .......................... 257/24; 257/20; 257/40; 257/E51.04; 977/742

(58) Field of Classification Search .......... 257/E51.04, 257/24
See application file for complete search history.

(56) References Cited

U.S. PATENT DOCUMENTS

| 4,942,441 A * | 7/1990 | Konishi et al. ............. 257/351 |
| 6,325,909 B1 | 12/2001 | Li et al. |
| 6,891,227 B1 * | 5/2005 | Appenzeller et al. ....... 257/346 |
| 2004/0023514 A1 * | 2/2004 | Moriya et al. .............. 438/778 |

OTHER PUBLICATIONS

Chen et al., "Aligning single-wall carbon nanotubes with an alternating-current electric field," Appl. Phys. Lett., Jun. 4, 2001, vol. 78, No. 23, pp. 3714-3716.*
Frank G. Shi, "Advanced IC Interconnect and Packaging: Materials and Processing Issues", Project Report 2000-01 for MICRO Project 00-088.
Jamin Ling et al., "Direct Bump-on-Copper Process for Flip Chip Technologies", Kulicke & Soffa—Flip Chip Division, Agere Systems Inc.
R. Martel et al., "Carbon Nanotube Field-Effect Transistors and Logic Circuits", 2000 ACM 1-58113-461-Apr. 2, 2006.

* cited by examiner

*Primary Examiner*—Jerome Jackson
(74) *Attorney, Agent, or Firm*—Fish & Richardson P.C.

(57) ABSTRACT

One or more semiconducting or conducting regions of a device such as a transistor may comprise molecular materials such as nanotubes or similar materials. Regions of a conductive alignment pattern used to align the nanotubes may be proximate to one or more ends of the nanotube. Additionally, a contact region may be proximate to each end of the nanotube to provide electrical contact to the nanotube. Nanotubes or the like may be in communication with device interconnection regions on a device substrate and may further be in communication with a package connection region on a package substrate.

19 Claims, 6 Drawing Sheets

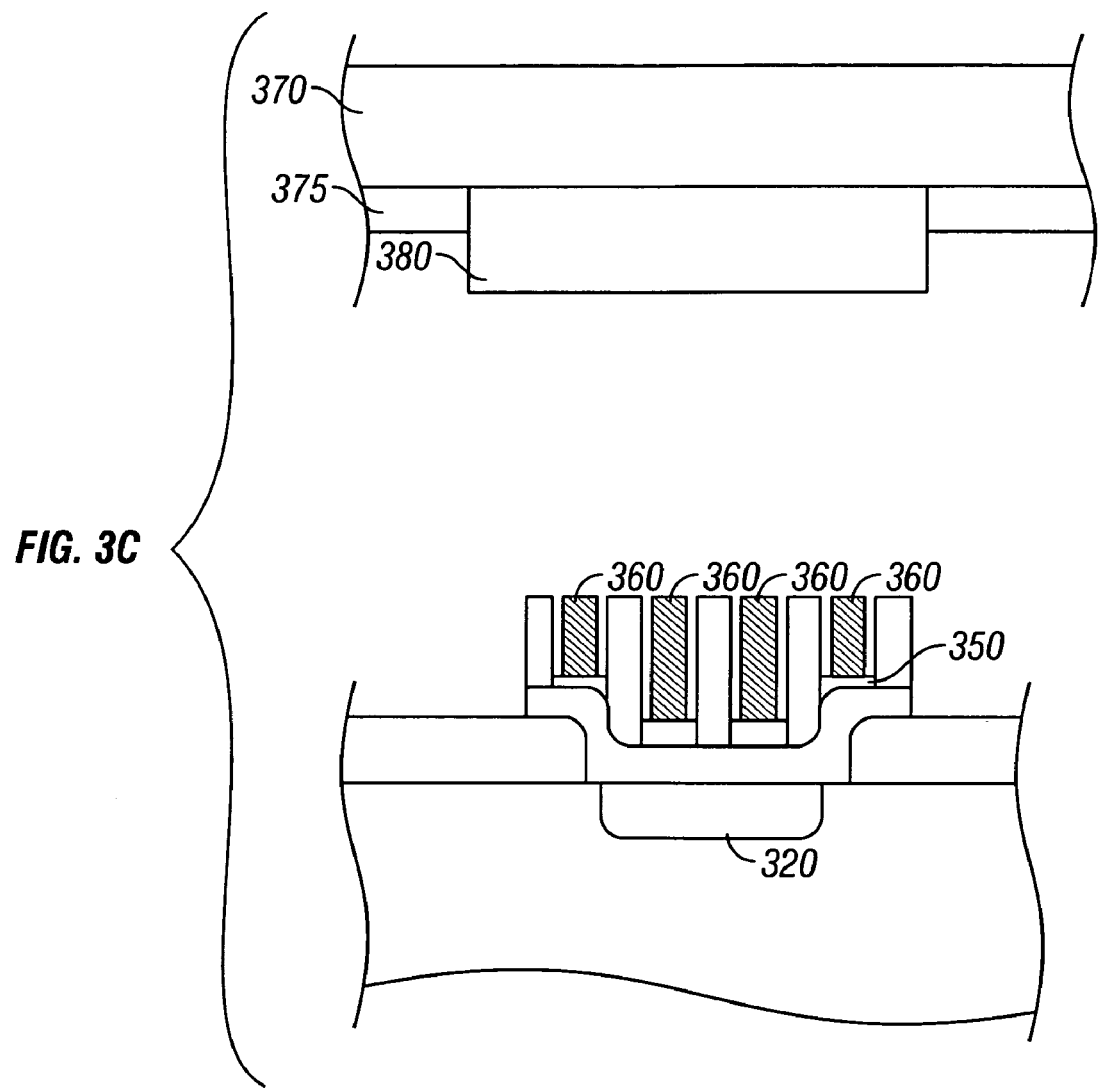

NANOTUBES FOR INTEGRATED CIRCUITS

BACKGROUND

Integrated circuits are generally fabricated by patterning a succession of spatially related layers on a substrate. The patterned layers form electronic devices and interconnections, separated by insulating materials. Conventional materials for integrated circuits include conducting materials such as aluminum, copper, and polysilicon, semiconducting materials such as p- and n-doped silicon, and insulating materials such as silicon dioxide and silicon nitride.

A number of dice may be patterned on a substrate such as a silicon wafer, where each die includes an integrated circuit with a number of connection points for making electrical contact with the integrated circuit. Each die may then be electrically and structurally connected to a packaging substrate.

For example, after a passivation step, an array of bumps may be formed on the connection points of a die. The bumps may be formed by electroplating a bump material (e.g., a lead-tin material, or copper) on a base layer metal (BLM) material.

After separating the die from the wafer, the array of bumps may be aligned with complementary solder bumps on a packaging substrate. The system may be heated so that the solder flows, connecting the die to the packaging substrate.

DESCRIPTION OF DRAWINGS

FIGS. 3A to 3C are cross sectional views of a substrate on which carbon nanotubes are being grown using a template, according to an implementation.

Like reference symbols in the various drawings indicate like elements.

DETAILED DESCRIPTION

Integrated circuits incorporating conventional semiconducting, conducting, and insulating materials are widely available. However, in certain circumstances, these conventional materials may not be optimal.

For example, it may be difficult to reduce the feature sizes of CMOS transistors (e.g., the gate length) below about 10 nm. It may also be difficult to reduce the size of metallization features due to electromigration effects, as well as increased resistivity due to surface scattering.

The systems and techniques described herein may overcome some of the challenges of conventional materials by using molecular materials such as carbon nanotubes for at least some device/integrated circuit features.

Figure 1:
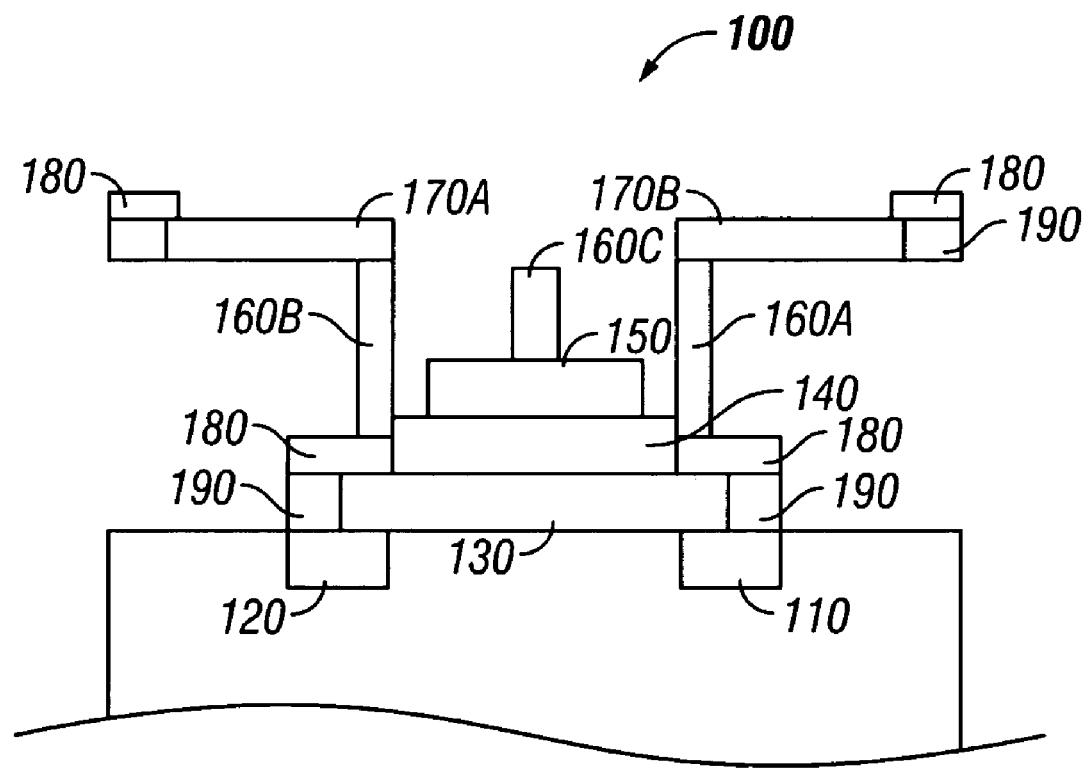
FIG. 1 is a cross sectional view of a transistor structure including features that may incorporate nanotubes, according to some implementations.

FIG. 1 shows an implementation of a transistor 100. Transistor 100 includes a source region 110, a drain region 120, a channel region 130, a gate oxide region 140, and a gate region 150. Transistor 100 further includes vertical conductor regions 160A, 160B, and 160C in communication with source region 110, drain region 120, and gate region 150. Transistor 100 further includes horizontal metallization regions 170A and 170B.

According to some implementations, one or more of the semiconducting or conducting regions of transistor 100 may comprise molecular materials (e.g., nanotubes or similar materials). In order to provide contact with a nanotube incorporated in transistor 100, contact regions such as regions 180 of FIG. 1 may be provided. In order to position a nanotube as desired, transistor 100 may include regions of a conductive alignment pattern, such as regions 190 of FIG. 1. Regions 190 are portions of a conductive alignment pattern used to position one or more nanotubes appropriately in transistor 100 as described below.

Fabricating electronic devices incorporating nanotubes poses a number of challenges. For example, positioning nanotubes at the desired locations and with the desired orientation may be difficult. It may also be difficult to ensure that there are no extraneous nanotubes positioned to negatively affect the operation of the electronic device.

However, the current inventor recognized that despite the difficulty of incorporating molecular materials in electronic devices, doing so may provide a number of benefits. For example, molecular materials such as carbon nanotubes may be able to conduct at high current densities without suffering electromigration failure. Therefore, carbon nanotubes may enable smaller device sizes than conventional materials. Carbon nanotubes also have high thermal conductivity, high electrical conductivity, are mechanically strong, and are chemically stable.

In one implementation, one or more carbon nanotubes may be incorporated into a generally horizontal device feature such as channel region 130 of FIG. 1. The conductance of semiconducting carbon nanotubes decreases strongly with increasing gate voltage. Thus, semiconducting carbon nanotubes may be said to be p-type (but may be made n-type as described below), and may be used in channel regions of field effect transistors.

Figure 2A:
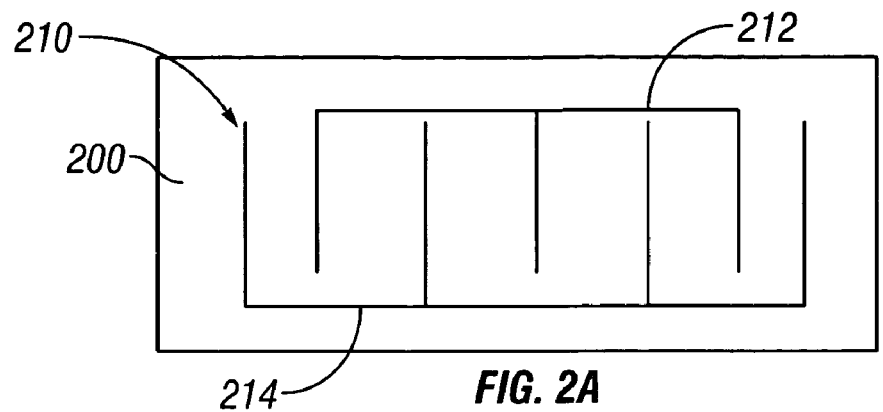
FIGS. 2A to 2D are top views of a substrate, showing the formation of features incorporating nanotubes, according to an implementation.

FIGS. 2A through 2D illustrate the fabrication of a channel region incorporating carbon nanotubes. In FIG. 2A, a conductive pattern 210 having a first portion 212 and a second portion 214 is formed on a substrate 200, which includes source and drain regions (e.g., source and drain regions formed using conventional methods or incorporating nanotubes). Conductive pattern 210 is used to position the pre-fabricated nanotubes on the substrate so that a first end of one or more nanotubes will be in communication with a source region and a second end of the one or more nanotubes will be in communication with an associated drain region.

Conductive pattern 210 may be formed using, for example, polysilicon; cobalt, nickel or other salicides; refractory metals such as nickel (Ni), cobalt (Co), gold (Au), platinum (Pt), rhodium (Rh), molybdenum (Mo), tantalum (Ta), rubidium (Ru), tungsten (W), niobium (Nb), zirconium (Zr), hafnium (Hf), iridium (Ir), lanthanum (La); noble metals such as Ru, Rh, Pt, Au; and combinations thereof.

Figure 2B:
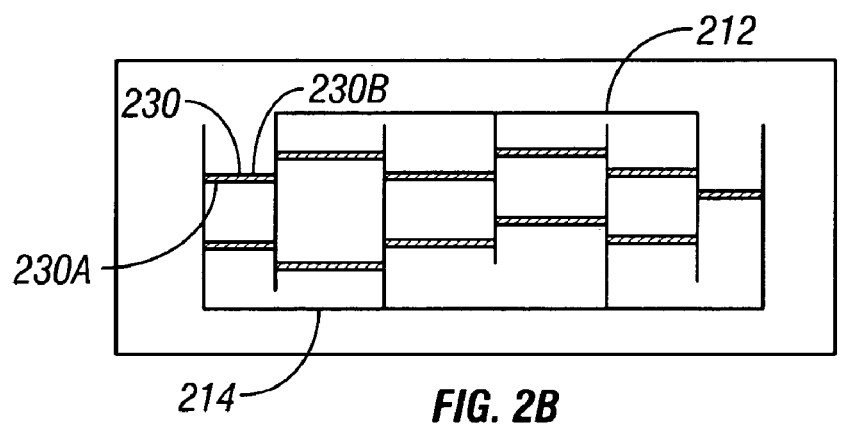

In FIG. 2B, functionalized, pre-fabricated single wall carbon nanotubes 230 are provided to the surface of substrate 200. Nanotubes 230 are functionalized so that a first end portion 230A is negatively charged and a second end portion 230B is positively charged. For example, nanotube 230 may be functionalized using a COOH— process or by using a process incorporating strong mineral acids such as HNO$_3$ or HCl. A negative voltage is applied to first portion 212 of conductive pattern 210, while a positive voltage is applied to second portion 214 of conductive pattern 210. As a result, nanotubes 230 are aligned in the direction of the electric field as shown.

Figure 2C:
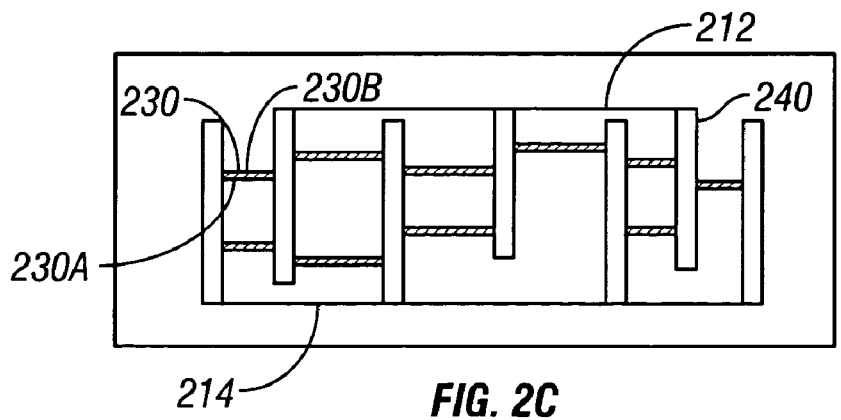

In FIG. 2C, conductive material 240 is selectively deposited to cover portions of conductive pattern 210 and to make contact with nanotubes 230 in the desired positions. Conductive material may be selectively deposited using, e.g., CVD, electroplating, electroless plating, or atomic layer deposition (ALD).

Figure 2D:
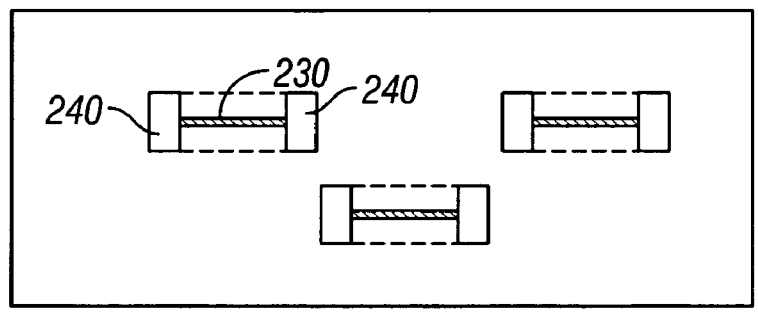
Figure 2E:
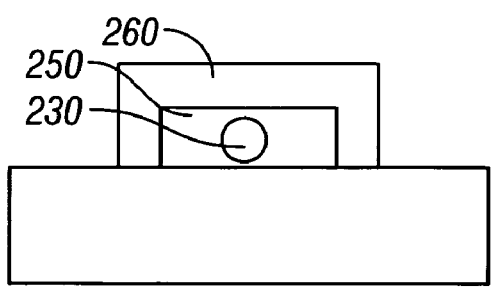
FIG. 2E is a cross sectional view of a substrate with a channel region incorporating a nanotube, according to an implementation.
Figure 2F:
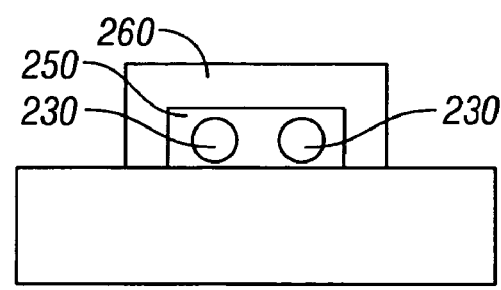
FIG. 2F is a cross sectional view of a substrate with a channel region incorporating multiple nanotubes, according to an implementation.

In FIGS. 2D to 2F, gate dielectric material 250 is deposited on substrate 200. Gate dielectric material 250 may include SiO$_2$, SiN, SiC, SiCN, carbon-doped oxide (CDO), high dielectric constant materials such as HfO$_2$ and ZrO$_2$, or other material. Gate material 260 may then be deposited on substrate 200. Gate material 260 may include polysilicon, TiN, Ru, Co, Ni, Al, or other material. The gate electrode, gate oxide, nanotubes and conducting pattern are then patterned to form transistor structures and to remove portions of conductive pattern 210 and undesired nanotubes 230. FIG. 2E shows a side view of a single channel transistor structure, while FIG. 2F shows a side view of a multi-channel transistor structure.

Further processing may be performed to fabricate one or more integrated circuits including structures such as those shown in FIGS. 2E and 2F. Contacts to source and drain regions may be formed by etching vias, which may then be filled using an appropriate material. Appropriate materials include polysilicon, salicides, metals such as Ni, Co, Au, Pt, Rh, Mo, Ta, Ru, W, Nb, Zr, Hf, Ir, La, or other conductors. Metallization and inter-layer dielectric (ILD) layers may then be formed. A passivation layer (e.g., silicon nitride or polyimide) may be deposited on the integrated circuits, which may then be separated and packaged.

As noted above, nanotubes 230 may be fabricated prior to forming transistor 200. For example, nanotubes 230 may be grown using a chemical vapor deposition (CVD) process. Nanotubes grown using CVD processes may be either conducting or semiconducting (depending on the chirality and diameter of the tube). Therefore, after the nanotubes are grown, they may need to be sorted to separate nanotubes having desired properties from other nanotubes.

To sort nanotubes, they may first be suspended in a solution (e.g., they may be suspended in isopropanol using sonication). The length of the nanotubes may then be reduced (e.g., by sonication in strong acid such as nitric acid). The ends of the nanotubes may be functionalized as noted above, so that one end is positively charged and the other end is negatively charged. The nanotubes may then be sorted to separate conductive nanotubes from semiconductive nanotubes (e.g., using laser trapping).

Semiconducting nanotubes grown using a CVD process are generally p-type, but may be made n-type by using vacuum annealing and/or doping. For example, a p-type nanotube can be converted to n-type by annealing in vacuum (to remove oxygen). Alternately, the nanotubes may be doped using alkali metals such as Li, Na, K, Cs, or by using mono-metallofullerene encapsulating lanthanide elements (such as Ce, Nd, Gd, Dy, etc.) Alternately, the nanotubes may be doped by partial chemical functionalization (using, e.g., fluorine), and/or by substitutional doping on the sidewalls of the nanotube (using, e.g., boron, nitrogen, etc.)

Molecular materials such as carbon nanotubes may provide a benefit in other configurations. For example, carbon nanotubes may be used to package integrated circuits. Existing packaging configurations may be unsatisfactory in some circumstances. For example, high current densities may cause electromigration failure in packages incorporating bumps using conventional materials such as copper or lead-tin alloys. Additionally, since it may be difficult to reduce the size of the bumps (and thus the bump density), conventional materials may limit the device density that may be achieved.

The current inventor also realized that carbon nanotubes may provide an unexpected benefit when packaging circuits incorporating low dielectric constant ("low k") materials. Low k materials are relatively fragile and may be damaged when materials such as copper bumps are used for connecting an integrated circuit to a packaging substrate. Unlike copper bumps, carbon nanotubes can absorb stress by bending, and so may be less likely to lead to damage than existing packaging configurations.

Carbon nanotubes may be used to connect a die to a packaging substrate as follows. Devices and interconnects may be fabricated on a substrate (e.g., a number of dice including integrated circuits may be fabricated on a silicon wafer). A passivation layer (e.g., silicon nitride or polyimide) may then be deposited and patterned. Nanotubes may then be grown in-situ at appropriate locations on each die.

Figure 3A:
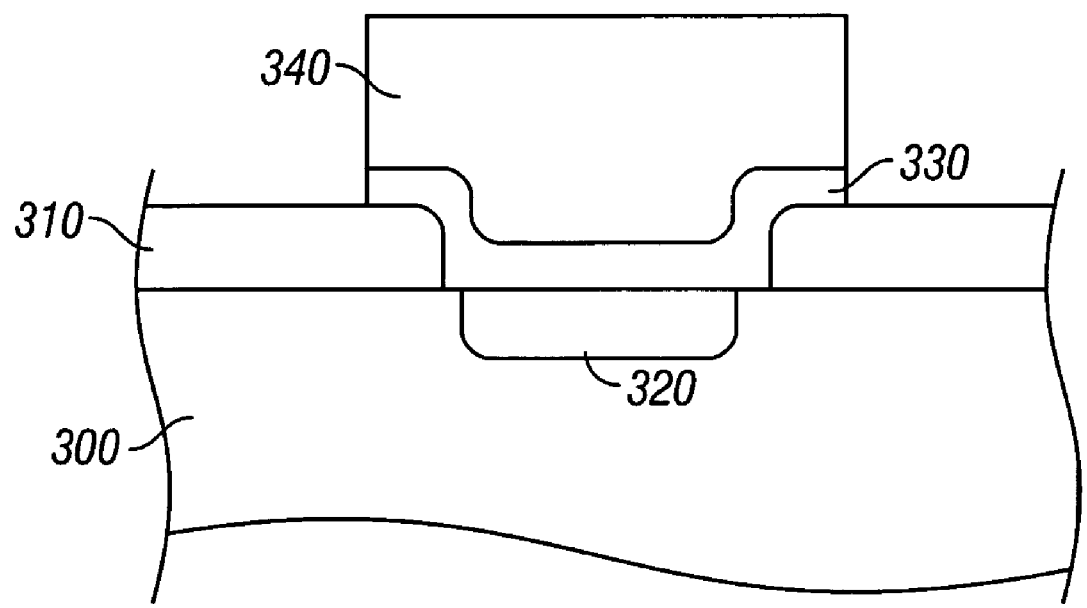
Figure 3B:
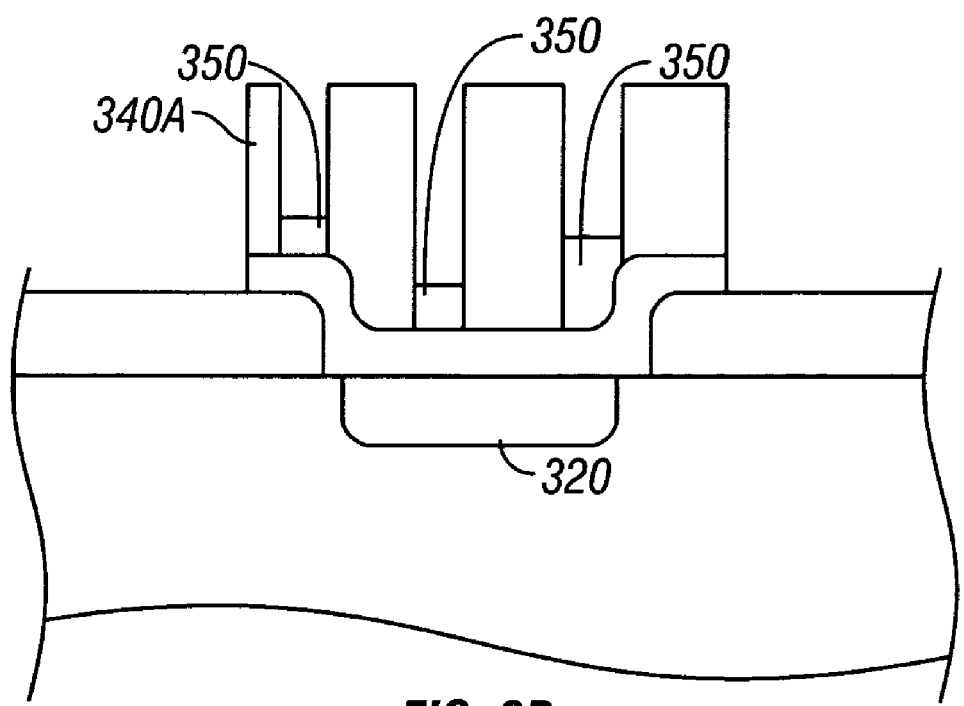

FIGS. 3A to 3C show an implementation for growing nanotubes in-situ. In FIG. 3A, a substrate 300 includes a connection region 320 to provide electrical contact with one or more devices on substrate 300 (not shown). Substrate 300 has a passivation layer 310, in which an opening has been etched and a base layer metal (BLM) region 330 formed. A template material region 340 is formed on region 330. Template region 340 may be formed by sputtering an aluminum layer on substrate 300.

In FIG. 3B, pores are formed in template material region 340, forming porous region 340A; for example, by anodizing the aluminum to form porous aluminum oxide. Catalyst material 350 is selectively deposited into an opening in region 340A. Catalyst material 350 may comprise, for example, cobalt, nickel, cobalt molybdenum, and may be deposited by plating or other appropriate method.

In FIG. 3C, nanotubes 360 may then be selectively deposited onto catalysts 350 using chemical vapor deposition (CVD), laser, or arc techniques. The nanotubes may be single-wall or multi-wall carbon nanotubes. Template material may then be selectively removed (e.g., porous aluminum oxide may be removed by etching using HCl). Substrate 300 may then be connected to a packaging substrate 370 having a passivation layer 375 so that nanotubes 360 are in communication with a package connection region 380 associated with connection region 320 of substrate 200. For example, package connection region 380 may comprise a solder region that may be heated to connect package connection region 380 to nanotubes 360.

Figure 4A:
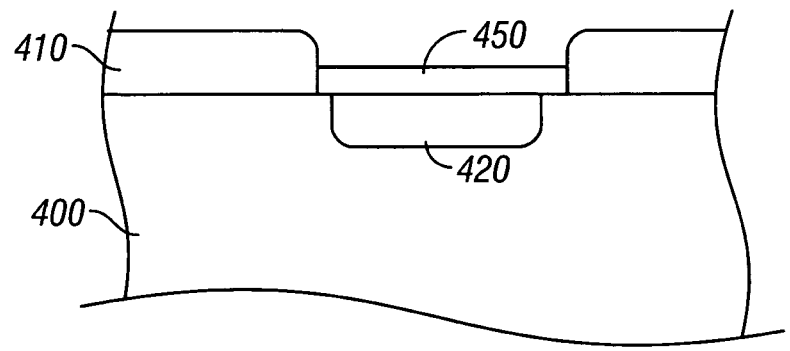
FIGS. 4A to 4B are cross sectional views of a substrate on which carbon nanotubes are being grown using an external electric field, according to an implementation.
Figure 4B:
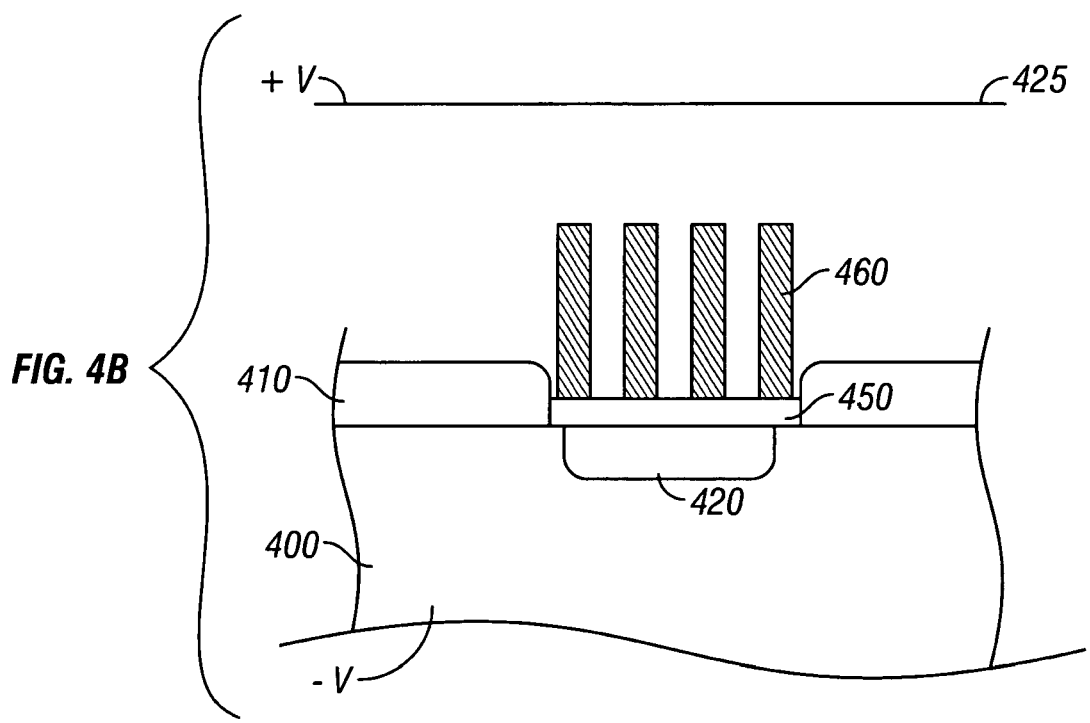

In the implementation illustrated in FIGS. 3A to 3C, the nanotubes grow in the direction defined by the template material. FIGS. 4A to 4B show another implementation for growing nanotubes in-situ. Rather than using a template to control the growth direction, an electric field may be used. In FIG. 4A, a substrate 400 includes a connection region 420 to provide electrical contact with one or more devices on substrate 400 (not shown). Substrate 400 has a passivation layer 410 with an opening in which catalyst material 450 is deposited directly onto a substrate 400.

In FIG. 4B, a voltage is applied to an electrode 425 and a voltage of opposite polarity is applied to substrate 400. Nanotubes 460 may then be selectively deposited onto catalyst regions 450. The applied voltage may thus be used to control the growth direction of the nanotubes.

After the nanotubes have been grown at the appropriate locations on the wafer, the dice may be separated. Each die may then be aligned with a packaging substrate including solder bumps at appropriate locations. Heat may be applied to flow the solder and connect the die to the packaging substrate.

Referring again to FIG. 1, other regions of devices such as transistor 100 may incorporate nanotubes. For example, source region 110 and drain region 120 may include one or more nanotubes. In an implementation, recesses may be formed at the desired locations in the substrate and pre-fabricated nanotubes of the appropriate conductivity type may be dispensed on the substrate. In some implementations, a conducting pattern and fabrication process such as that described above may be used to incorporate functionalized nanotubes in source region 110 and drain region 120. Other horizontal device features may be fabricated in a similar manner (e.g., gate 150 and metallization regions 170A and 170B).

For example, metallization regions such as regions 170A and 170B (as well as regions on other metallization layers) may be formed by forming conductive alignment patterns similar to those shown in FIG. 2A. The patterns may be formed using materials such as Ag, Cu, Au, Al, Ni, Co, Pd, Pt and their alloys, alloys including refractory metals, alloys including metalloids such as B, P, or N, or other appropriate material.

Prefabricated, functionalized nanotubes may be aligned using the alignment patterns. Conductive material may then be selectively deposited to cover portions of the conductive patterns and to provide electrical contact regions with those nanotubes in desired positions. The conductive material used may be, for example, one of the materials listed above or other appropriate material, and may be selectively deposited using CVD, ALD, electroless plating or electroplating. The metallization layer may then be patterned using lithography and etch processes.

It may be difficult to form vertical device features using pre-fabricated nanotubes. However, nanotubes may be grown in-situ as described above and illustrated in FIGS. 3A through 3C or FIGS. 4A and 4B. For example, vertical conductor regions 160A through 160C or regions through interlevel dielectric (ILD) layers between metallization layers may incorporate conducting nanotubes grown in-situ. ILD materials may include silicon dioxide, low k materials such as CDO, or other materials.

For example, a vertical device feature through an ILD layer may incorporate a nanotube as follows. One or more vias may be formed defining the region in which the nanotube is to be positioned. Since the vias define the desired growth direction for the nanotubes, no template or electric field is necessary. Instead, catalyst material may be provided in the vias as desired and nanotubes grown as described above.

A number of implementations have been described. Nevertheless, it will be understood that various modifications may be made without departing from the spirit and scope of the invention. For example, different device types may be formed using molecular materials such as carbon nanotubes. Accordingly, other implementations are within the scope of the following claims.

What is claimed is:

1. An apparatus, comprising:
    a substrate;
    a first conductive alignment region on the substrate;
    a second conductive alignment region on the substrate;
    a carbon nanotube on the substrate, the carbon nanotube having a first end portion proximate to the first conductive alignment region on the substrate, the carbon nanotube further having a second end portion proximate to the second conductive alignment region;
    a first conducting contact region separate from the first conductive alignment region, the first conducting contact region in communication with the first end portion; and
    a second conducting contact region in communication with the second end portion.

2. The apparatus of claim 1, wherein the carbon nanotube has a length L, and wherein the first conductive alignment region and the second conductive alignment region are separated by a distance about equal to L.

3. The apparatus of claim 2, further including a plurality of other carbon nanotubes having a length L positioned on the substrate.

4. The apparatus of claim 3, wherein a first end of each of the plurality of other carbon nanotubes is proximate to a conductive alignment region, and wherein a second end of each of the plurality of other carbon nanotubes is proximate to another conductive alignment region.

5. The apparatus of claim 1, wherein the carbon nanotube is included in a channel region of a transistor and wherein the carbon nanotube has a first conductivity type.

6. The apparatus of claim 5, wherein the first end of the carbon nanotube is proximate to a source region of the transistor, the source region having a second conductivity type, and wherein the second end of the carbon nanotube is proximate to a drain region of the transistor having the second conductivity type.

7. The apparatus of claim 6, wherein the first conductivity type is p-type and the second conductivity type is n-type.

8. The apparatus of claim 6, wherein the first conductivity type is n-type and the second conductivity type is p-type.

9. The apparatus of claim 6, further including a gate region and a gate oxide region, the gate oxide region positioned at least partially between the carbon nanotube and the gate region, and wherein the carbon nanotube is responsive to a gate voltage applied to the gate region.

10. The apparatus of claim 9, wherein the gate comprises a nanotube.

11. The apparatus of claim 9, wherein the gate comprises a material selected from the group consisting of polysilicon, titanium nitride, rubidium, cobalt, nickel, and aluminum.

12. The apparatus of claim 5, wherein the channel region further includes another carbon nanotube.

13. The apparatus of claim 1, wherein the carbon nanotube is included in an interconnect layer of an integrated circuit.

14. An apparatus, comprising:
    a device substrate;
    a plurality of devices patterned on the device substrate;
    a plurality of device interconnection regions positioned on the device substrate, each of the plurality of device interconnection regions in communication with one or more of the plurality of devices;
    a carbon nanotube having a first end portion adjacent to and in communication with one of the plurality of device interconnection regions; and
    first and second nanotube alignment structures, respectively producing an electric field that automatically aligns the carbon nanotube.

15. The apparatus of claim 14, further comprising a package substrate having a package connection region associated with the one of the plurality of device interconnection regions, and wherein a second end of the carbon nanotube is in communication with the package connection region.

16. The apparatus of claim 14, further including a plurality of other carbon nanotubes, each of the plurality of other carbon nanotubes having a first end in communication with one of the plurality of device interconnection regions.

17. The apparatus of claim 16, wherein each of the plurality of other carbon nanotubes has a second end in communication with an associated one of a plurality of other package connection regions.

18. The apparatus of claim 14, wherein the first end of the carbon nanotube is further in communication with a catalyst material region.

19. The apparatus of claim 1, wherein the carbon nanotube is not substantially overlapping the first conductive alignment region and the second conductive alignment region.

* * * * *